United States Patent
Hoffman et al.

(10) Patent No.: US 7,405,537 B2
(45) Date of Patent: Jul. 29, 2008

(54) APPARATUS AND METHODS FOR ESTIMATING THE STATE-OF-CHARGE OF A POWER SOURCE

(75) Inventors: Allan J. Hoffman, Berkley, MI (US);
Edward J. Abeska, Ferndale, MI (US);
Scott A. Rush, Plymouth, MI (US)

(73) Assignee: GM Global Technology Operations, Inc., Detroit, MI (US)

( * ) Notice: Subject to any disclaimer, the term of this patent is extended or adjusted under 35 U.S.C. 154(b) by 409 days.

(21) Appl. No.: 11/017,348

(22) Filed: Dec. 20, 2004

(65) Prior Publication Data

US 2006/0132092 A1      Jun. 22, 2006

(51) Int. Cl.
*H01M 10/44* (2006.01)
*H01M 10/46* (2006.01)

(52) U.S. Cl. .................................... 320/132
(58) Field of Classification Search ................ 320/132, 320/134, 136, 149; 340/635, 636.1, 636.12
See application file for complete search history.

(56) References Cited

U.S. PATENT DOCUMENTS 4,484,130 A * 11/1984 Lowndes et al. ............ 320/116
4,775,827 A * 10/1988 Ijntema et al. .............. 320/132
5,808,445 A * 9/1998 Aylor et al. ................. 320/132
6,072,299 A * 6/2000 Kurle et al. ................. 320/112

* cited by examiner

Primary Examiner—Edward Tso

(57) ABSTRACT

Methods and apparatus are provided for estimating the remaining state-of-charge of a non-rechargeable power source, such as a back-up battery for an electronic module normally connected to a primary power source. A processor within the electronic module implements a prediction algorithm, in order to monitor the temperature of the back-up attery, and to calculate various current draws of the back-up battery. The processor adjusts the nominal self-discharge rate of the back-up battery in accordance with the measured temperatures, and calculates an adjusted self-discharge quantity. The processor also accumulates current draw data and reduces the initial state-of-charge value of the back-up battery by the temperature-adjusted self-discharge quantity and the cumulative current draw quantities to determine a remaining state-of-charge of the back-up battery. At a predetermined state-of-charge threshold level, an indicator can be activated to advise a user to replace the back-up battery.

15 Claims, 2 Drawing Sheets

APPARATUS AND METHODS FOR ESTIMATING THE STATE-OF-CHARGE OF A POWER SOURCE

TECHNICAL FIELD

The present invention generally relates to a non-rechargeable power source, and more particularly relates to an algorithm for estimating the state-of-charge of a non-rechargeable power source.

BACKGROUND

Recent developments in automotive technology have introduced various devices to enhance the safety and convenience of the driving experience. For example, air bags are now commonly deployed in vehicles to reduce the likelihood of injury in an accident, and on-board navigation systems are used to help the driver find his/her way to a destination. Another recent development is an on-board telematics system, such as the "OnStar" system. This type of telematics system enables the driver to access many types of services via a wireless communication from the vehicle to an affiliated call center. The call center can then respond to a driver's request for service, which typically includes navigation instructions, roadside assistance, emergency services, and other types of information.

In general, a telematics system is configured as an electronic module installed in a vehicle, and connected to a primary power source, which is typically the main vehicle battery. This type of system is generally intended to provide a driver with various types of call center services, and also to provide an automatic notification capability to a call center in the event of an emergency situation, such as the deployment of an air bag in the vehicle. Therefore, it is generally desirable that a back-up power source be available for the electronic module in the event of primary power disruption. The back-up power source is generally in the form of a relatively low power battery, designed to provide sufficient power to the electronic module to accommodate an emergency situation.

Over lengthy time periods, however, a back-up battery is typically subject to a gradual loss of power capability, even when it is not used to power an electronic module. For example, a typical battery will experience a nominal self-discharge rate (shelf life), and may also experience loss of charge due to various types of leakage currents when connected to any type of electronic circuitry. Therefore, it is desirable to monitor the state-of-charge of a back-up battery in order to implement a timely replacement if the state-of-charge falls below a predetermined threshold level.

Various techniques can be used to anticipate the state-of-charge replacement/threshold level, such as estimation calculations or periodic test sampling. Typically, a simple estimation calculation is based primarily on the nominal self-discharge rate, or shelf life, of the battery. However, this type of calculation may not take other factors into consideration, such as temperature changes and miscellaneous current drains. For example, according to the Arrhenius rate law, chemical reaction rates rise exponentially with reagent temperature. As such, a battery self-discharge rate would be related to temperature.

Another technique involves the periodic sampling of battery voltage, but this intrusive type of testing typically causes current drains from the back-up battery, which can further shorten the life of the battery. Moreover, this technique is generally not a reliable measure of state-of-charge because battery cells typically have a flat voltage curve until nearly discharged.

Accordingly, it is desirable to provide a method of predicting a replacement threshold level for a back-up battery that is minimally intrusive, and that adjusts the predicted self-discharge rate of the back-up battery in accordance with measured temperature values. In addition, it is desirable to provide a prediction method that approximates temperature values during periods when actual temperature measurements cannot be made, such as, for example, when the electronic module is turned off. Furthermore, other desirable features and characteristics of the present invention will become apparent from the subsequent detailed description and the appended claims, taken in conjunction with the accompanying drawings and the foregoing technical field and background.

BRIEF SUMMARY

According to various exemplary embodiments, devices and methods are provided for estimating the remaining state-of-charge of a non-rechargeable power source that is typically used as a back-up battery for an electronic module, in the event of a loss of primary power. One exemplary method comprises the steps of:

a) calculating an adjusted self-discharge rate of the non-rechargeable power source, based on its nominal self-discharge rate being adjusted for temperature;

b) calculating a quantity of parasitic leakage current draw from the non-rechargeable power source;

c) calculating a quantity of voltage sampling current draw from the non-rechargeable power source;

d) calculating a quantity of transient current draw from the non-rechargeable power source; and e) calculating an estimated remaining state-of-charge of the non-rechargeable power source by reducing the initial rating of the non-rechargeable power source in accordance with the temperature-adjusted self-discharge rate, the quantity of parasitic leakage current draw, the quantity of voltage sampling current draw, and the quantity of transient current draw.

One exemplary device comprises an electronic module connected to a primary power source, with the electronic module having a back-up non-rechargeable power source with an initial ampere-hour rating and a nominal self-discharge rate. The exemplary device includes a processor that is configured to monitor the temperature of the back-up non-rechargeable power source, and to calculate the various cumulative current draws from the back-up non-rechargeable power source. These current draws typically include parasitic leakage current (when the back-up power source is connected to the electronic module), check current (during voltage sampling), and transient current (when the electronic module is operating at reduced power from the back-up power source, due to the loss of primary power).

The processor is further configured to calculate an estimated remaining state-of-charge of the back-up non-rechargeable power source, based on the reduction of the initial ampere-hour rating due to a temperature-adjusted amount of self-discharge, a cumulative parasitic leakage current draw, a cumulative check current draw, and a cumulative transient current draw. A predetermined state-of-charge threshold is typically set to enable the activation of some type of indicator when the estimated remaining state-of-charge value falls below the predetermined threshold level. As such, a user can be advised to replace the back-up non-rechargeable power source on a timely basis.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Various embodiments of the present invention pertain to the area of estimating the state-of-charge of a non-rechargeable power source. When this type of power source is used as an emergency back up for a primary power source, it is desirable to predict the end of useful life of the back-up power source in order to replace it in a timely fashion. In order to make as accurate a state-of-charge prediction as possible, certain ancillary factors, such as temperature variations and various types of leakage current draws, can be considered in addition to the nominal shelf-life rating of the back-up power source. Therefore, a prediction algorithm that includes the shelf-life rating and the relevant ancillary factors can be developed to make an accurate estimation of the state-of-charge of a non-rechargeable power source.

Figure 1:
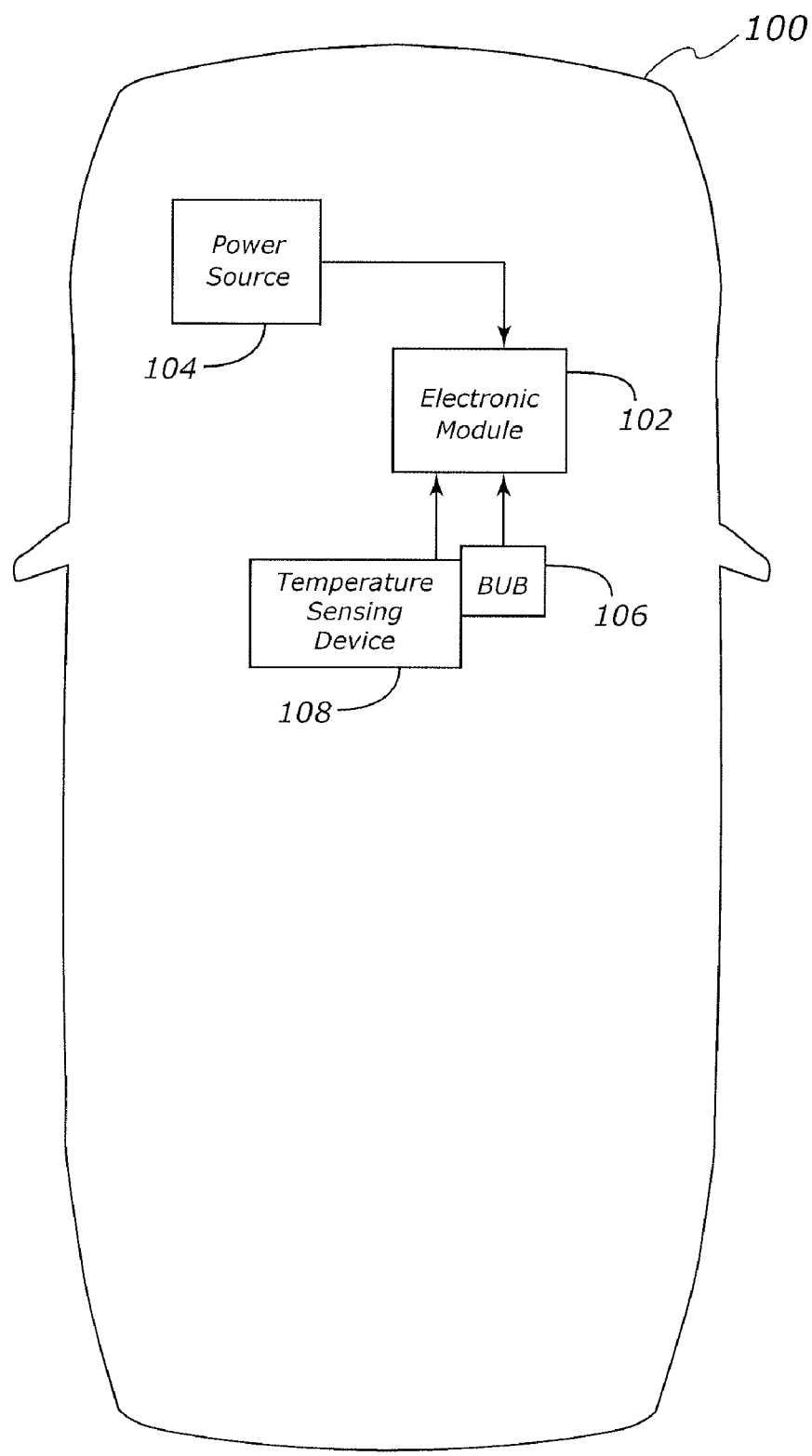
FIG. 1 is a block diagram of an exemplary electronic module connected to a primary power source and a back-up power source.

According to an exemplary embodiment of a system for predicting the state-of-charge of a non-rechargeable power source, as shown in FIG. 1, an electronic module 102 is installed within a vehicle 100. Electronic module 102 is normally powered by a primary power source 104, such as the main battery of vehicle 100. A non-rechargeable power source 106 is typically connected to electronic module 102 via some type of electronic switching circuit (e.g., a transistor) that enables non-rechargeable power source 106 to provide emergency operating power to electronic module 102 in the event of a loss of primary power source 104. In addition, a temperature-sensing device 108, such as a thermistor, is typically coupled to non-rechargeable power source 106, as will be described more fully below.

In this exemplary embodiment, electronic module 102 represents a telematics communication device between a driver and a service call center, e.g., the OnStar system. This type of system typically enables a driver to access a variety of services (navigation instructions, roadside assistance, emergency help, etc.) by simply pressing an appropriate button associated with the electronic module 102, which can automatically provide a wireless connection to an OnStar call center. In the event of a loss of primary power source 104, electronic module 102 can continue to operate for a limited period of time with power from back-up power source 106. For example, a typical back-up power source 106 can operate electronic module 102 at essentially full power for approximately 300 seconds, although other embodiments may have widely varying parameters. During this limited operating time, the driver can generally use the OnStar system to request emergency assistance. When no call is being made, electronic module 102 is typically switched into a low power mode in order to conserve the charge state of back-up power source 106. This low power mode is typically designated as a "monitor" mode, in which electronic module 102 can still receive certain signals, such as an airbag release signal.

Back-up power source 106 is typically a battery, with an initial ampere/hour rating and a nominal self-discharge rate, as generally supplied by the battery manufacturer. The nominal self-discharge rate, however, is quite sensitive to temperature variations. For example, a typical nominal self-discharge rate is approximately 1.3% per year at an ambient temperature of 20 degrees C. However, this exemplary rate typically doubles for every 10 degree increase, and typically halves for every 10 degree decrease in temperature, in accordance with the previously noted Arrehnius rate law. That is, at 30 degrees C., the rate would be approximately 2.6%, and at 10 degrees C., the rate would be approximately 0.65%. As such, an accurate determination of self-discharge rate generally depends on the corresponding temperature of the back-up battery.

According to an exemplary embodiment of a prediction algorithm for the state-of-charge of a back-up battery (BUB) 106, a nominal self-discharge rate (R) can be adjusted for temperature variations, as typically measured by a temperature-sensing device 108 coupled to BUB 106, and electrically connected to measuring circuits within electronic module 102. That is, for any temperature sample (j), a temperature adjustment factor can be expressed as follows, based on a nominal self-discharge rating specified at 20 degrees C., and in accordance with the temperature relationship described above:

$$2^{(Temp(j)-20)/10}$$

That is, for a temperature reading (Temp(j)) of 20 degrees C., this temperature-adjustment expression would yield a value of 1; for a reading of 30 degrees C., the value would be 2, and for a reading of 10 degrees, the value would be ½. As noted above, these temperature-adjustment values would be in agreement with the exemplary specifications cited. Where there may be a different known relationship between temperature and self-discharge rate, a mathematical expression corresponding to that relationship can be used in a similar manner to determine an appropriate temperature adjustment factor.

An exemplary self-discharge factor ($E_1$), based on the above described temperature-adjustment expression, can be developed for a number of measurements made over a period of time, where an exemplary period of time is one year, to correspond to the typical self-discharge rating. For example, if a measurement is taken once every 10 minutes (measurement interval D=10), the number of intervals of the time duration (Y) during a year would equal 525,960/D, or 525,960/10 minutes. Therefore, an exemplary temperature-adjusted self-discharge factor $E_1$ can be expressed in accordance with the previously described temperature/self-discharge relationship as follows:

$$E_1 = 1/Y * 2^{(Temp(j)-20)/10} \quad \text{(Equation 1)}$$

For a nominal self-discharge rate R and an initial ampere/hour rating $C_0$ in the exemplary algorithm embodiment, the loss of battery charge quantity due to the temperature-adjusted self-discharge factor $E_1$ can be expressed on the basis of averaging a summation of temperature-adjusted self-discharge factors over a given period of time:

$$C_0 * SUM(R * E_1).$$

The preceding loss of charge expression is dependent on actual temperature measurements, which generally require the electronic module 102 to be in an "ON" state. When electronic module 102 is "OFF", as is normally the case when the vehicle is parked, for example, the temperature measuring circuitry is typically inoperative. Since there is still a self-discharge of BUB 106 during electronic module 102 OFF time, a calculation of an average self-discharge value can be used in place of actual self-discharge measurements. Therefore, an exemplary embodiment of a calculated temperature-interpolated self-discharge factor $E_2$ can be expressed as follows:

$$E_2 = T_{off}*(SUM(1/Y*2^{(Temp(k)-20)/10})/V + SUM(1/Y*2^{(Temp(m)-20)/10})/V))/2 \quad \text{(Equation 2)}$$

where $T_{off}$=the number of hours that electronic module 102 is in the Off state for the measured fraction of a year, and V is a non-OFF state interval between 1 and 24 hours, and where Temp(k)=the temperature values measured in a V period before the Off State;

Temp(m)=the temperature values measured in a V period after the Off State;

k=the sample interval in a V period before the Off State; and m=the sample interval in a V period after the Off State.

Therefore, given the nominal self-discharge rate R and initial ampere/hour rating $C_0$ in the exemplary algorithm embodiment, the loss of battery charge quantity due to the self-discharge factor $E_2$ can be expressed on the basis of averaging a summation of temperature-adjusted self-discharge factors prior to and after an electronic module 102 OFF period of time as:

$$C_0*SUM(R*E_2).$$

A typical BUB 106 is also subject to loss of charge due to various current draws. These draws can include, for example, parasitic leakage current ($I_L$), voltage check current ($I_C$), and BUB 106 monitor current ($I_M$), as will be explained below. For each type of exemplary current draw, the corresponding active time period can be multiplied by the respective current draw to determine the cumulative current draw loss of charge factors.

Parasitic leakage current ($I_L$) generally occurs whenever BUB 106 is electrically connected to electronic module 102, for a time period $T_L$. Voltage check current ($I_C$) can occur whenever BUB 106 is checked for electrical connection to electronic module 102, for a time period $T_C$. BUB monitor current ($I_M$) can occur when primary power source 104 is inactive, and electronic module 102 is operating from BUB 106 in a low power (BUB monitor) mode, for a time period $T_M$. Typically, the values of $I_L$, $I_C$, and $I_M$ are predetermined by the electronic module 102 manufacturer, and are generally used as static values in the exemplary algorithm. Time period $T_L$ is typically measured by a timer running continuously in electronic module 102, time period $T_C$ is generally predetermined as a static value by the electronic module 102 manufacturer, and time period $T_M$ is typically accumulated by a timer in electronic module 102 whenever electronic module 102 is operated in the BUB monitor mode. Therefore, the above described exemplary loss of charge terms can be expressed as ($I_L*T_L$), ($I_C*T_C$), and ($I_M*T_M$).

In accordance with the above described loss of charge factors, a general exemplary prediction algorithm for the estimated state-of-charge of BUB 106 can be expressed as follows:

$$C(N)=C_0*\{1-SUM[R*E_1+R*E_2]\}-I_L*T_L-I_M*T_M-I_C*T_C \quad \text{(Equation 3)}$$

where N is the point in time a measurement is taken.

Figure 2:
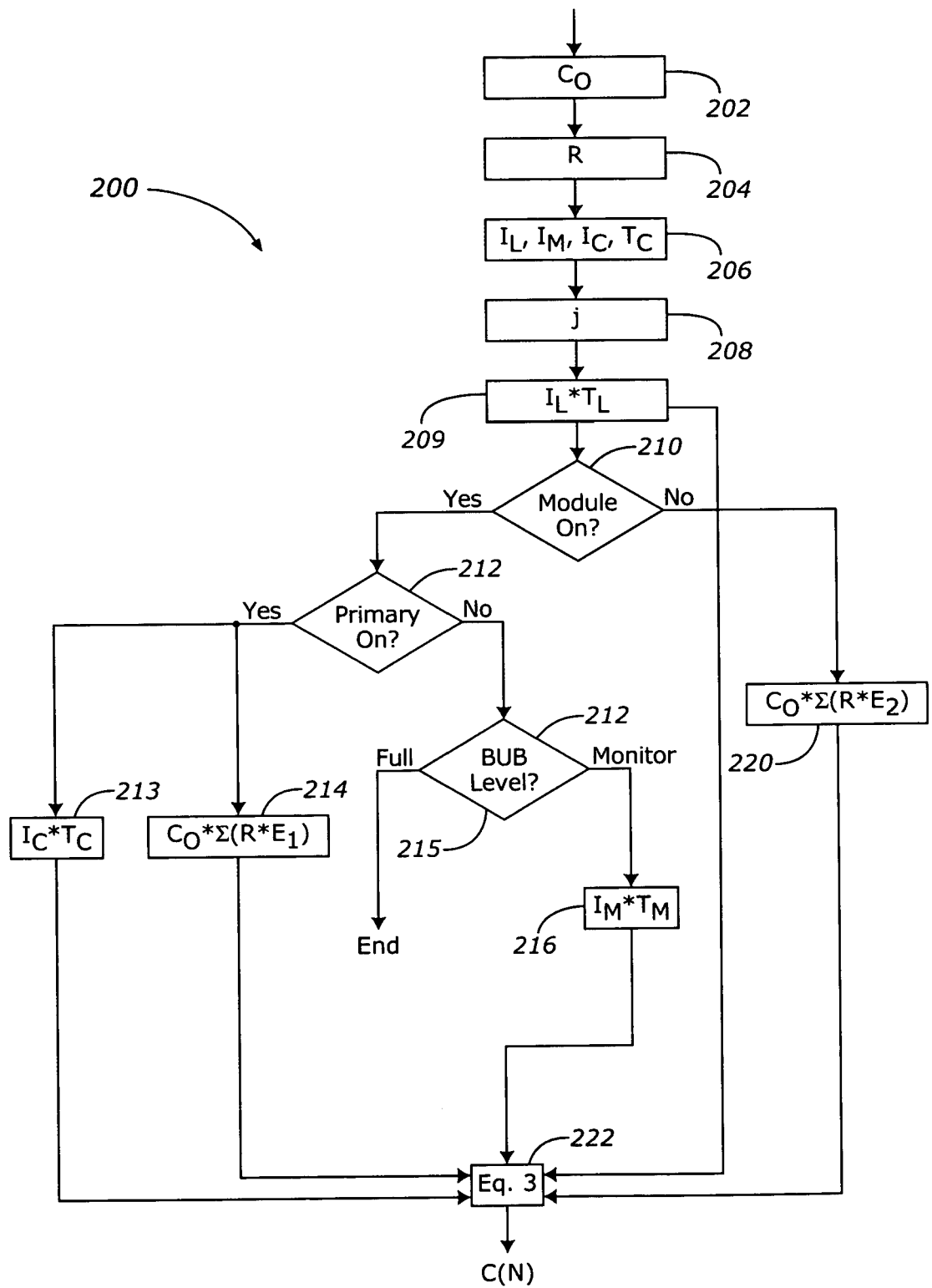
FIG. 2 is a flow diagram of an exemplary algorithm for predicting an estimated state-of-charge of a non-rechargeable power source.

The exemplary prediction algorithm (Equation 3) is depicted as a flow diagram 200 in FIG. 2. Initially, the predetermined parameters are set: $C_0$ in step 202, R in step 204, $I_L$, $I_M$, $I_C$, $T_C$ in step 206, and j in step 208. Step 209 indicates that the parasitic leakage term $I_L*T_L$ is being accumulated whenever electronic module 102 is connected to BUB 106.

Step 210 represents the state of electronic module 102. When electronic module 102 is ON ("Yes" in step 210), and if primary power source 104 is supplying power to electronic module 102 ("Yes" in step 212), the temperature-adjusted self-discharge quantity $C_0*SUM(R*E_1)$ can be calculated (step 214), as described above, and applied to Equation 3, as part of step 222.

Step 213 represents an $I_C*T_C$ value, which typically occurs when a voltage check is made at ignition turn on to ascertain whether or not BUB 106 is present. When the voltage check is made, $I_C*T_C$ can be calculated by the processor in electronic module 102 and applied to Equation 3, as part of step 222.

If there is a loss of primary power source 104 ("No" in step 212), electronic module 102 is automatically switched over to a BUB 106 power level (step 215). If full power operation of electronic module 102 is required, the exemplary algorithm no longer applies ("End"), since BUB 106 will operate at its full capacity. Otherwise, electronic module 102 is placed in the "BUB Monitor" state, as previously described, and the $I_M*T_M$ term can be calculated (step 216) and applied to Equation 3, as part of step 222.

Referring again to step 210, if electronic module 102 is in the OFF state ("No" in step 210), the temperature-interpolated self-discharge quantity $C_0*SUM(R*E_2)$ can be calculated, as previously described (step 220), and applied to Equation 3, as part of step 222. Finally, in step 222, a predicted value of the remaining state-of-charge of BUB 106 (C(N)) can be calculated in accordance with Equation 3. That is, the initial charge $C_0$ is reduced by the various discharge factors, as implemented by the exemplary algorithm represented by Equation 3:

$$C(N)=C_0*\{1-SUM[R*E_1+R*E_2]\}-I_L*T_L-I_M*T_M-I_C*T_C.$$

Accordingly, the shortcomings of the prior art have been overcome by providing an improved prediction algorithm for estimating a remaining state-of-charge of a back-up power source (BUB). The exemplary algorithm adjusts and interpolates the nominal self-discharge rate of the BUB for temperature variations during the self-discharge period. The exemplary algorithm also calculates relevant current draws from the BUB during various modes of operation, in order to arrive at an accurate state-of-charge estimate without the use of intrusive voltage measurements that can shorten the life of the BUB.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method of estimating the remaining state-of-charge of a non-rechargeable power source configured as a back-up power source for an electronic module normally powered by a primary power source, comprising the steps of:
   a) calculating a self-discharge factor based on temperature;
   b) combining a nominal self-discharge rate of the non-rechargeable power source with the self-discharge factor and an initial state of charge of the non-rechargeable power source to produce a temperature-adjusted self-discharge quantity;
   c) calculating a quantity of parasitic leakage current draw from the non rechargeable power source;
   d) calculating a quantity of voltage sampling current draw from the non-rechargeable power source;
   e) calculating a quantity of transient current draw from the non-rechargeable power source;
   f) subtracting the temperature-adjusted self-discharge quantity, the quantity of parasitic leakage current draw, the quantity of voltage sampling current draw, and the quantity of transient current draw from the initial state-of-charge of the non-rechargeable power source to generate an estimate of a remaining state-of-charge of the non-rechargeable power source; and
   g) displaying the generated estimate to a user.

2. The method of claim 1 wherein the initial state-of-charge of the non-rechargeable power source is based on the ampere-hour rating of the non-rechargeable power source.

3. The method of claim 1 wherein the nominal self-discharge rate of the non-rechargeable power source is based on the self-discharge rating of the non-rechargeable power source.

4. The method of claim 1 wherein the self-discharge factor calculation is based on measured temperature values of the non-rechargeable power source.

5. The method of claim 1 wherein the self-discharge factor calculation is based on interpolated self-discharge factor values.

6. The method of claim 1 wherein the parasitic leakage quantity from the non-rechargeable power source is based on a predetermined value of the parasitic leakage current.

7. The method of claim 1 wherein the quantity of voltage sampling current draw from the non-rechargeable power source is based on a predetermined value of current drain during voltage sampling.

8. The method of claim 1 wherein the quantity of transient current draw from the non-rechargeable power source is based on a predetermined value of current drain during a low power operating mode of the electronic module.

9. The method of claim 8 wherein the transient current draw occurs when the non-rechargeable power source is used to power the electronic module at less than full power when the primary power source is removed.

10. A back-up power source for an electronic module connected to a primary power source, comprising:
   a power source having an initial ampere-hour rating and a nominal self discharge rate;
   a temperature measuring device configured to measure the temperature of the power source; and
   a processor associated with the electronic module and coupled to the -temperature measuring device;
      wherein the processor is configured to receive the temperature measurements of the power source from the temperature measuring device, and to calculate therefrom a temperature-adjusted self discharge quantity for the power source, and wherein the processor is further configured to calculate an estimated remaining state-of-charge of the power source, based on the reduction of the initial ampere-hour rating due to the temperature-adjusted self discharge quantity, and on the further reduction of the initial ampere-hour rating due to a cumulative parasitic leakage current draw, a cumulative voltage sampling check current draw, and a cumulative low power mode transient current draw.

11. The back-up power source of claim 10 wherein the temperature-measuring device is a thermistor.

12. The back-up power source of claim 10 wherein the parasitic leakage current draw accumulates during the time that the back-up power source is connected to the electronic module.

13. The back-up power source of claim 10 wherein the voltage sampling check current draw accumulates only when the back-up power source connection to the electronic module is checked.

14. The back-up power source of claim 10 wherein the transient current draw accumulates only when there is a loss of primary power and the electronic module is operating from the back-up power source in a low power mode.

15. A method for generating an estimate of the remaining state-of-charge of a power source, the method comprising the following algorithm, the method comprising the steps of:
   performing the following algorithm to generate the estimate:

$$C(N)=C_0*\{1-\text{SUM}[R*E_1+R*E_2]\}-(I_L*T_L)-(I_M*T_M)-(I_C*T_C),$$

where $C(N)$ is the remaining state-of-charge,
   where $C_0$ is an initial state-of-charge of the non-rechargeable power source,
   where $R$ is a nominal self-discharge rate for the non-rechargeable power sources,
   where $E_1$ is a temperature-adjusted discharge factors,
   where $E_2$ is a temperature-averaged discharge factors,
   where $I_L$ is a parasitic leakage current,
   where $T_L$ is a first period of time,
   where $I_M$ is a back-up battery monitor current,
   where $T_M$ is a second period of time,
   where $I_C$ is a voltage check current,
   where $T_C$ is a third period of time,
   where $I_L*T_L$ is a cumulative parasitic leakage current draw,
   where $I_M*T_M$ is a cumulative monitor current draw, and
   where $I_C*T_C$ is a voltage check current draw; and displaying the generated estimate to a user.

* * * * *